United States Patent [19]

Komatsu

[11] 4,423,434

[45] Dec. 27, 1983

[54] SEMICONDUCTOR DEVICE HAVING TWO OR MORE SEMICONDUCTOR ELEMENTS WITH PAIRED CHARACTERISTICS REGULARLY ARRANGED IN A SEMICONDUCTOR SUBSTRATE

[75] Inventor: Shigeru Komatsu, Yokohama, Japan

[73] Assignee: Tokyo Shibaura Denki Kabushiki Kaisha, Kasawaki, Japan

[21] Appl. No.: 212,503

[22] Filed: Dec. 3, 1980

[30] Foreign Application Priority Data

Dec. 19, 1979 [JP] Japan .................... 54-165390

[51] Int. Cl.³ .................... H01L 27/02; H01L 29/84; H01L 29/04; H01L 23/28
[52] U.S. Cl. .................... 357/51; 357/26; 357/55; 357/60; 357/72
[58] Field of Search ............. 357/60, 55, 51, 16, 357/52 R, 52 T, 72

[56] References Cited

U.S. PATENT DOCUMENTS

| | | | |
|---|---|---|---|
| 3,965,452 | 6/1976 | Seidel et al. | 357/60 |
| 4,025,941 | 5/1977 | Kanda et al. | 357/26 |
| 4,236,832 | 12/1980 | Komatsu et al. | 357/60 |
| 4,268,848 | 5/1981 | Casey et al. | 357/60 |

FOREIGN PATENT DOCUMENTS

| | | | |
|---|---|---|---|
| 55-125661 | 9/1980 | Japan | 357/60 |
| 1236401 | 6/1971 | United Kingdom . | |
| 1514180 | 6/1978 | United Kingdom . | |

OTHER PUBLICATIONS

IBM Technical Disclosure Bulletin, vol. 15, No. 2, Jul. 1972 "Resistor Tracking on Monolithic Integrated Circuits" M. A. Battista et al., pp. 423-424.

Patent Abstracts of Japan, E-99, Mar. 22, 1979, vol. 3/No. 34.

German Auslegeschrift 19 06 324, published Sep. 4, 1969.

Primary Examiner—Andrew J. James
Assistant Examiner—J. Carroll
Attorney, Agent, or Firm—Finnegan, Henderson, Farabow, Garrett & Dunner

[57] ABSTRACT

Semiconductor elements are arranged in a semiconductor substrate substantially equidistantly of a dicing line and oriented in the same direction. A region where the semiconductor elements are regularly arranged is the one where, when the semiconductor substrate and a semiconductor element are integrally formed with a sealing member, a characteristic of the semiconductor element abruptly changes, ranging from the center line of the dicing line to a point having stress of 90% of the stress developed in the center area of the semiconductor substrate or ranging from the center line of the dicing line to a point distanced from the center line by a distance 1.8 times the thickness of the semiconductor substrate or less. The semiconductor substrate with semiconductor elements arranged therein is integrally formed by a sealing member.

4 Claims, 15 Drawing Figures

FIG. 1

PRIOR ART

FIG. 2

(unit KG/CM²)

FIG. 3

(unit KG/CM²)

EQUAL RESISTANCE CHANGE ΔR/RO
LINES OF RESISTOR ALONG y-DIRECTION
ON A (100) CRYSTAL FACE. unit : %

FIG. 8

EQUAL RESISTANCE CHANGE $\Delta R/R_0$ LINES OF RESISTOR ALONG y-DIRECTION ON A (111) CRYSTAL FACE. unit : %

SEMICONDUCTOR DEVICE HAVING TWO OR MORE SEMICONDUCTOR ELEMENTS WITH PAIRED CHARACTERISTICS REGULARLY ARRANGED IN A SEMICONDUCTOR SUBSTRATE

The present invention relates to a semiconductor device having two or more semiconductor elements with corresponding (paired) characteristics regularly arranged in a semiconductor substrate.

It is known that semiconductor elements, such as n- or p-type resistive elements, transistors and diodes, are formed into a wafer made of silicon or germanium by injecting phosphorus or boron into the wafer. A plurality of semiconductor elements are disposed in chips formed by delineating the wafer by dicing lines, thereby to form a semiconductor device such as an IC.

The semiconductor devices are inspected in a probe test step of processing to be sorted into good and bad semiconductor devices. Then, in an assembling step of processing, each of the good semiconductor devices is assembled into a desired package capsule. After the encapsulated devices are subjected to a final test, those that successfully complete the final testing are delivered as products.

It is generally known that the characteristics of such semiconductor devices are different from those when the semiconductor elements are formed on a chip. Particularly, in the resistive elements, the resistance changes due to stress developed in the chip during the assembling stage. The phenomenon is known in general as a piezo-resistive effect. It is empirically known that semiconductor elements such as transistors or diodes are also influenced by the stress.

The chip bearing the necessary elements is sealed by a resin sealing method or a hermetic sealing method. Particularly, in the semiconductor device molded by the resin sealing method, stress caused by the resin mold shrinkage changes the characteristics of the semiconductor elements. The characteristic change arising from the stress is serious particularly in a semiconductor device with a linear characteristic having semiconductor elements such as resistors and transistors. In an extreme case, the product yield of the semiconductor devices is extremely reduced in the assembling step of the manufacturing process.

For solving the problem, there has been a proposal that the crystal face of the wafer or chip in which the semiconductor elements be arranged and the orientation of an arrangement of the elements be properly selected for releasing the stress effect of the semiconductor elements.

In forming the well known p-type resistors in the wafer or the chip, when the crystal face of the wafer is {100}, if the resistive element is formed in a direction of <100>, a distribution of the resistive characteristic formed by the piezo-resistive effect developed when the semiconductor subassembly is resin-sealed may be uniform. When the crystal face of the wafer is {811}, the same effect is attained by forming the resistive elements in a direction rotated by 45° from the <110> direction.

When the crystal face of the wafer is {111}, since there is no anisotropy of crystal, it is impossible to make uniform the distribution of the characteristic formed by the piezo-effect of the resistive element even if the resistive elements are arranged in any fashion. Often times it is impossible to set the crystal face of the wafer to {100} face and the orientation of the resistive element arrangement in the <100> direction or to set the crystal face of the wafer to the {811} face and the orientation of the arrangement of the resistive elements in the direction rotated by 45° from the <110> direction. In such a case, the distribution of the characteristic values on the wafer surface can not be made uniform. Accordingly, the resistance values are shifted from desired ones, resulting in undesirable paired values of the semiconductor elements.

As described above, the semiconductor elements such as transistors and diodes also change their characteristics due to the stress developed at the time of the resin-sealing. As known, the transistor is generally classified into a vertical type transistor which operates in the vertical direction and a lateral type transistor which operates in the horizontal direction, in accordance with the manufacturing method. The characteristic of the former transistor tends to change substantially corresponding to stress changing lines on the chip surface. The characteristic of the latter transistor tends to follow in the manner like that of the resistive elements. This is due to an analogy of the arrangement of the semiconductor layers. Therefore, the characteristic of the vertical type transistor little depends on the crystal face of the wafer. In this respect, it is impossible to employ the solution to improve the paired characteristics of the elements by properly employing the crystal face of the chip and the orientation of the arrangement of the elements as in the case of the resistive elements.

In the lateral type transistor, its characteristic changes are analogous to those of the resistive elements since it is influenced by the condition of the wafer surface. However, the anisotropy of the crystal is small, and therefore it has not the proper face and direction for ensuring the improvement of the paired characteristics of the elements. For this reason, when the semiconductor subassembly is sealed with resin, the characteristics of the elements are distributed non-uniformly, so that the characteristics of the semiconductor devices manufactured in this manner are not uniform, failing to have desired paired characteristics of the elements.

In designing the semiconductor device such as an IC and a LSI by forming semiconductor elements such as resistive elements, transistors and diodes on a single semiconductor chip, the usually employed method to obtain the desired paired characteristics of the semiconductor elements is that the elements are arranged close to one another and with the same configuration and in the same direction. This method is effective under a condition that in the resin-sealing process, the stress developed in the chip is uniformly distributed. However, the stress distribution is generally unfixed or non-uniform, so that it is impossible to obtain the desired paired characteristics.

Recently, LSI semiconductor devices have been manufactured in which a digital section with a digital function and a linear section with a linear function are formed on a single chip. In this device, the digital section is disposed on the central portion of the chip and the linear portion sensitive to the stress is located on the peripheral portion of the chip. With this arrangement, the characteristic of the device is sensitive to the stress distribution of the chip. This results in poor reliability of the electronic circuit.

Accordingly, an object of the present invention is to provide a semiconductor device with semiconductor elements formed in the same semiconductor substrate having desired paired characteristics, even after the assembly is sealed with resin.

To achieve the above object, there is provided a semiconductor device comprising a semiconductor substrate with dicing lines, and a plurality of semiconductor elements with paired characteristics which are disposed equidistantly apart from a center line of said dicing line with the same orientation with respect to each other in said semiconductor substrate, wherein the semiconductor elements are disposed in an area from the center line of the dicing line to a point having stress of 90% of the stress developed in the center region of the semiconductor substrate. The region for arranging the semiconductor elements may be an area ranging from the center line of the dicing line to a point separated from the center line by a distance of 1.8 times the thickness of the substrate or less.

With such an arrangement, changes of the characteristics of the semiconductor elements are made uniform in a specific region on the chip. Since the region where the semiconductor elements are regularly arranged may be determined by using the thickness of the semiconductor substrate as one of the parameters, the design of the device is made easy. Further, there is no need for selecting the specific face of the wafer and the specific orientation of the semiconductor elements. The design of the semiconductor device is free from the limitation of the crystal face selection of wafer. Thus, the paired characteristics of the semiconductor elements and the reliability of the semiconductor device are improved. The number of bad semiconductor devices manufactured checked in the inspection step of process following the assembling step is reduced to improve the production yield of the semiconductor devices. Therefore, the cost to manufacture is reduced.

Other objects and features of the invention will be apparent from the following description taken in connection with the accompanying drawings, in which.

Figure 1:
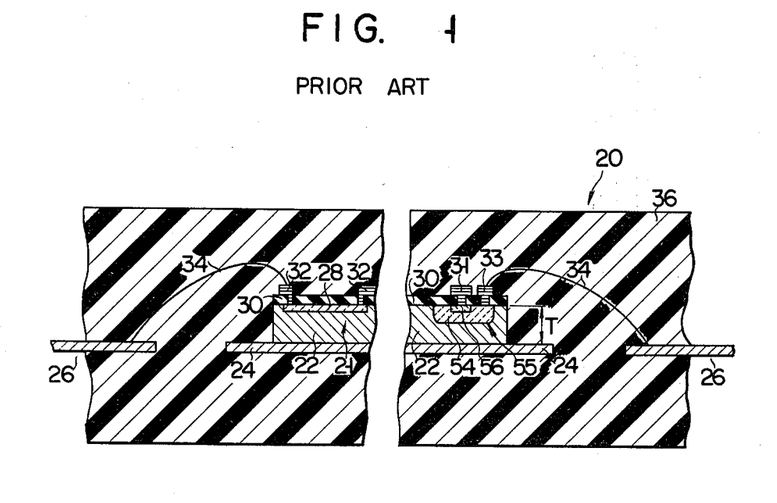
FIG. 1 is a cross sectional view of a conventional semiconductor device when resistive elements and bipolar-transistors arranged in a chip are integrally formed and resin-sealed.

Before proceeding with a description of the embodiments of the present invention, conventional problems and the way of solving them will be described. As shown in FIG. 1, a semiconductor device 20 with at least two resistor elements 21 and at least two or more bipolar transistors 55 arranged in a chip 22 made of semiconductor material is integrally formed by a sealing member 36. The chip 22 is disposed in a supporting member 24. The chip 22, which is an n-type semiconductor doped with $10^{15} \sim 10^{16}$ atoms/cm$^3$ of phosphorus, has a p-type resistance layer 28, a p-type semiconductor layer 54 and an n-type semiconductor layer 56, which are formed by diffusion, ion implantation or epitaxial process.

The resistance layer 28, which contains $10^{18}$ atoms/cm$^3$ of boron and has 2.7 $\mu$m of thickness, is at both ends in ohmic-contact with electrodes 32 made of aluminum, for example, thereby to form a resistor element 21. The p-type semiconductor layer 54 contains $10^{18} \sim 10^{19}$ atoms/cm$^3$ of boron. The n-type semiconductor layer 56 contains $10^{19} \sim 10^{21}$ atoms/cm$^3$ of phosphorus. The p-type semiconductor layer 54, the n-type semiconductor layer 56 and the n-type substrate 22 cooperate to form an npn bipolar-transistor 55.

The p-type semiconductor layer 54 and the n-type semiconductor layer 56 are provided with electrodes 31 and 33 made of aluminum in ohmic-contact therewith. These electrodes serve as an emitter electrode and a base electrode, respectively.

Electrodes 32, 31 and 33 are connected to lead frames 26 by bonding wires 34, although the connections of one of the electrodes 32 and of the electrode 31 to the lead frames are not illustrated. The chip 22 serving as a collector is supplied with a substrate bias voltage. An insulation layer 30 made of SiO$_2$ layered on the respective semiconductor surfaces protects the resistor element 21 and the bipolar-transistor 55. The semiconductor device 20 is sealed with a sealing member 36 made of resin, for example, to form a device such as an IC.

the characteristics of a plurality of transistors or resistor elements in the chip, which are sealed with the sealing member, are different from those of the elements before the elements are not sealed with the sealing member. This fact is known in this field. This characteristic change is recognized when a resin sealing member is used. The characteristic change arises from a stress developed in the chip by the mold shrinkage of the resin at the time of the resin sealing. Particularly, this phenomenon is known in general as the piezo-resistive effect.

The inventor mapped a two dimensional stress distribution on the surface of the chip by measuring resistance changes at the respective points before and after the resin sealing and, by considering the piezo-resistive effect and the symmetricity of a crystal, successfully overcame the above-mentioned drawback.

Figure 2:
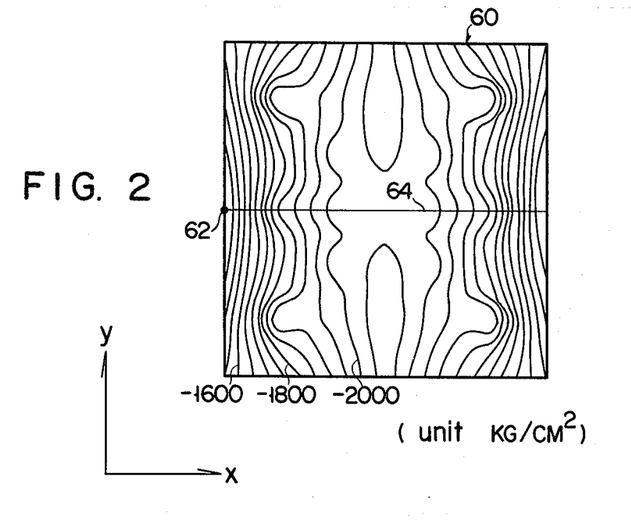
FIG. 2 is a graph of a distribution of stresses $\sigma_x$ in the x-direction in the surface of a chip when the chip is resin-sealed.

Turning now to FIG. 2, there is shown a stress distribution of a 3 mm square silicon chip 60 of 300 μm in thickness illustrating isostress lines of the $\sigma_x$ (Kg/cm$^2$) component of stress at normal temperature when such a chip is sealed in a plastic package in the moulding process. In the figure, minus (−) signs indicate each compression.

As seen from both the sides as viewed in the drawing, the isostress lines are distributed with high density along the sides, and therefore there are large changes in the stress there. In the central portion, the density of the isostress lines is thin, and therefore the stresses are uniformly distributed, although the stress is very large, approximately 2,000 Kg/cm$^2$.

Figure 3:
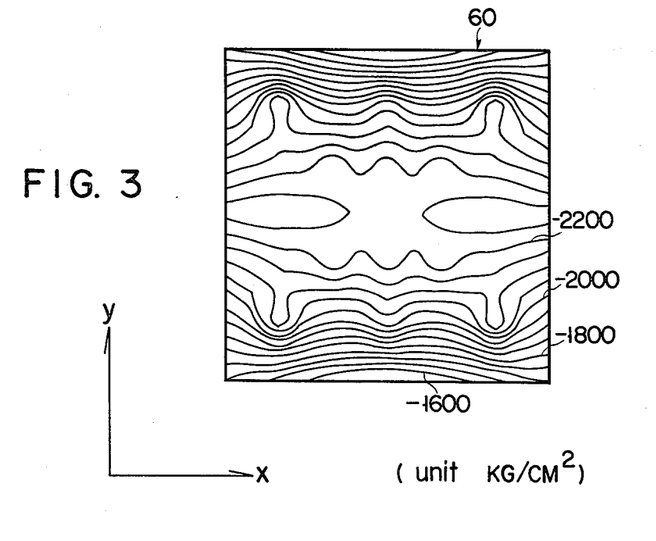
FIG. 3 is a graph of a distribution of stresses $\sigma_y$ in the y-direction in the surface of the chip when the chip is resin-sealed.

A stress distribution of a $\sigma_y$ component of stress of the chip used in FIG. 2 is illustrated in FIG. 3. There is observed a similar distribution over the chip surface.

Figure 4:
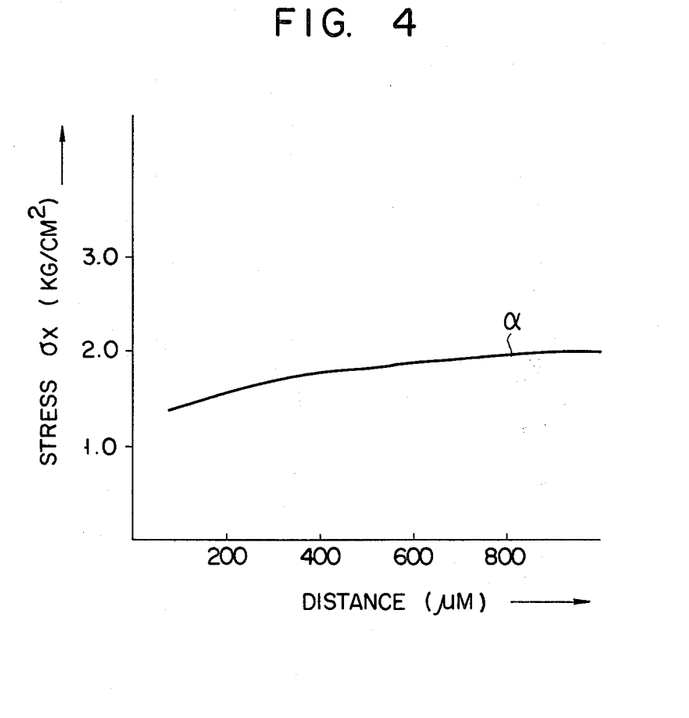
FIG. 4 is a graph in which a variation of the stresses $\sigma_x$ in the x-direction is plotted along a line 64 with an origin of a point 62 in FIG. 2.

FIG. 4 is a stress $\sigma_x$ variation along a line 64 originating from a point 62 in FIG. 2. As seen from the graph, the stress $\sigma_x$ is substantially saturated at a point of about 800 μm distance from an edge of the chip and reaches approximately 90% at a point of about 550 μm. The stress distribution on the chip surface sealed with resin is not dependent on the crystal face of the chip. However, a pattern of resistance values of the resistor elements arranged in the chip when those are sealed with resin depends on the crystal face of the chip and an orientation of an arrangement of resistors.

Figure 5:
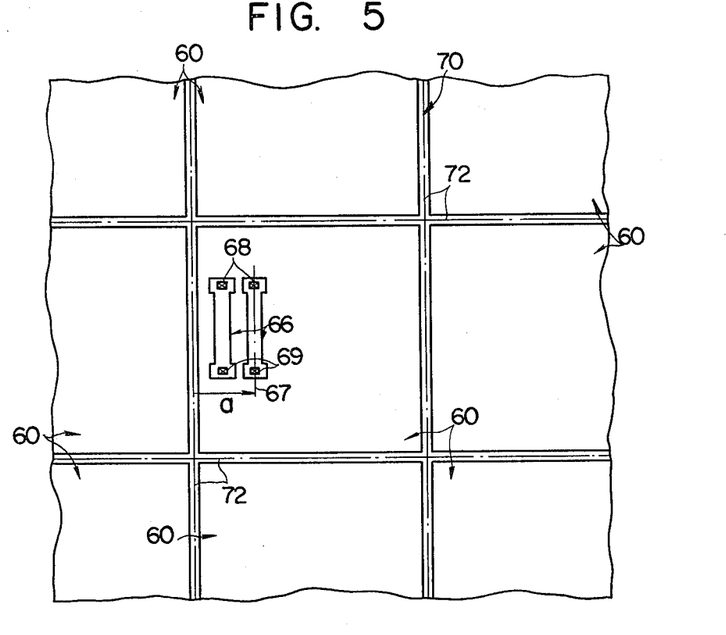
FIG. 5 is a plan view of an arrangement of resistive elements arranged in a wafer.

In FIG. 5, there is shown a semiconductor wafer with dicing lines 70 and chips 60 in which a pair of resistive elements 66 are arranged which should have corresponding characteristics. As shown, the resistive elements 66 are arranged so that their center lines 67 are in parallel with and apart by different distances from the center line 72 of the dicing line closest to them. Those resistive elements are p-type layers formed in an n-type substrate.

Figure 6:
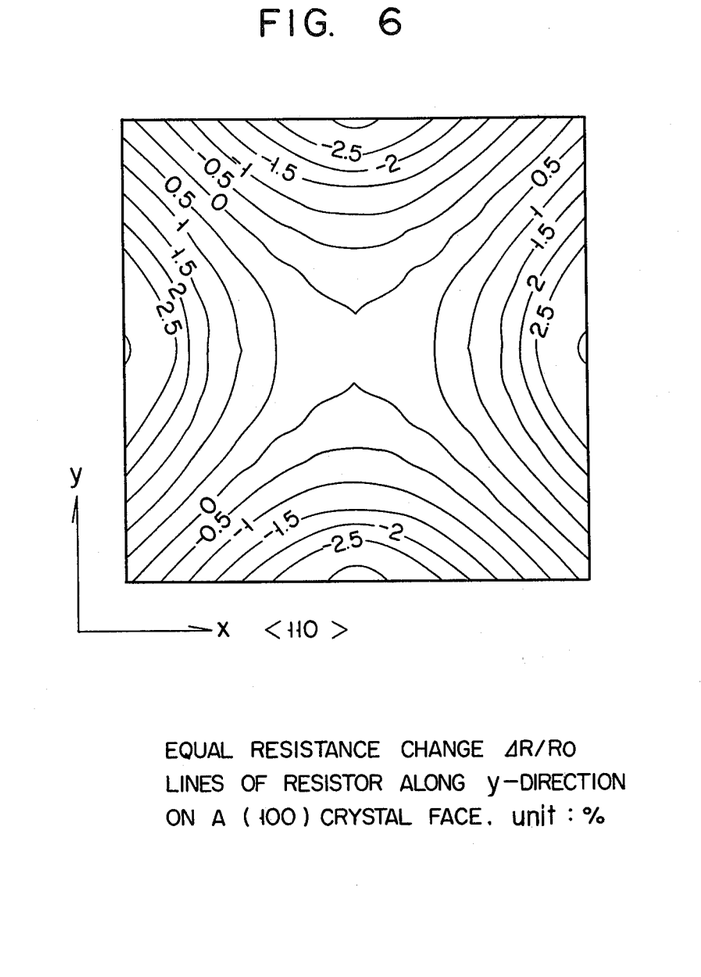
FIG. 6 is a distribution of resistance changes when resistive elements formed in a chip with a crystal face of {100} is integrally formed and resin-sealed.

Directed along the y-axis as shown in FIG. 5, a number of resistive elements with the same resistances were formed in a frequently used chip with a {100} crystal face, and the subassembly thus formed was sealed with resin. A distribution of resistances changes of the resistive elements thus arranged after those elements are resin-sealed is illustrated in FIG. 6. The resistances of those resistive elements were measured along the y-axis with the x-axis being <110> direction. In the graph, the parameters utilized are change rates of resistances ($R_o$) with reference to the resistances before the resistive elements are resin-sealed, and they are plotted in the form of isoresistance-change lines each connecting equal resistance change points.

The isoresistance-change lines are inclined with respect to the x- and y-axes on the respective corners of the chip. Accordingly, the best corresponding characteristics of the resistive elements on the corners are obtained by arranging the resistive elements along the isoresistance-change lines. On the center area of the chip, the isoresistance-change lines are substantially in parallel with the x- or y-axis. Therefore, the resistive elements must be arranged in parallel with and equidistantly from the edge of the chip. Further, the resistance changes of the resistive elements in the central area of the chip are distributed relatively uniformly. For this reason, the corresponding characteristics in the central area are relatively satisfactory even if the orientation of the arrangement of the resistive elements are considered not so very carefully.

Figure 7:
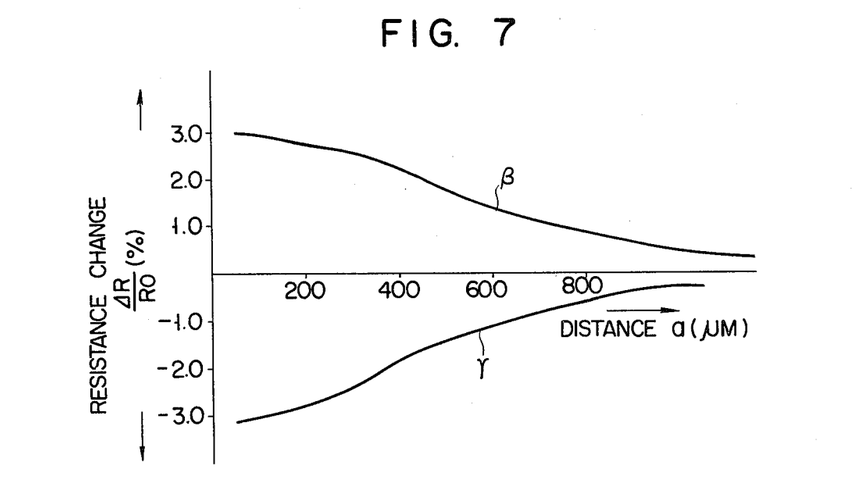
FIG. 7 is a graph for illustrating a variation of typical resistances with respect to a distance a in FIG. 5.

FIG. 7 is a graphical representation of variations of the change rates $\Delta R/R_o$ of the resistance values along a line bisecting the chip normal to the dicing line. In the graph, $\beta$ represents the variation in parallel with the x-axis, while $\gamma$ represents the variation in parallel with the y-axis. Both the curves saturate at a distance from about 800 μm from the edge of the chip. The distance is approximately 2.67 times the thickness of the 300 μm chip.

Figure 8:
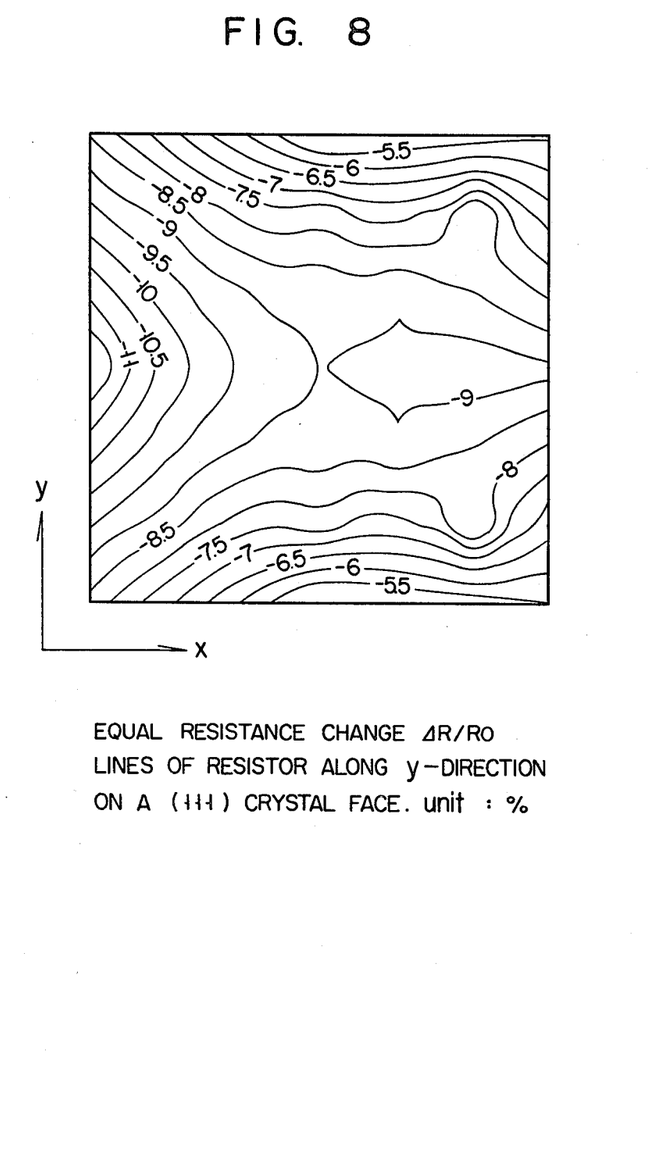
FIG. 8 shows a graph illustrating a distribution of resistances when resistive elements formed in a chip with the crystal face of {111} are integrally formed and resin-sealed.

Further, referring to FIG. 8, a number of resistive elements with the same resistances are formed along the y-axis, as in FIG. 5, in a chip with a crystal {111} face, which is also used frequently, and the subassembly is sealed with resin. A distribution of the resistance changes of the resistive elements from the resistances before those resistive elements are sealed is plotted with equal resistance change lines. The measurement of the resistances was made along the y-axis.

In the graph, the equal resistance change lines of the resistors at the corners on the upper-left and the lower-left corners of the chip are inclined with respect to the x- or y-axis, as in the previous case. On the upper and lower portions of the chip, the equal resistance lines are substantially in parallel with the x-axis. Therefore, the arrangement of the resistive elements in parallel with the x-axis and equidistantly from the edge of the chip provides satisfactory corresponding characteristics of the resistive elements. This arrangement of the resistive elements is important particularly in the portions close to the chip sides since the equal resistance change lines are distributed thickly. On the left portion of the chip as viewed in the drawing, the distribution of the equal resistance change lines is thin and spread out. Therefore, the arrangement orientation of the resistive elements there is not a critical matter.

As seen from the foregoing description, the stress distribution in the chip when the semiconductor subassembly is resin-sealed is not dependent on the crystal face of the chip, but resistance changes of the resistive elements depend on the selection of the crystal face of the chip. In the central region of the chip, the resistance-change distribution of the chip is thin regardless of the crystal face. Therefore, the orientation of the arrangement of the resistive elements is not critical for obtaining good twin characteristics of the resistive elements. In the portions near the chip edge, however, the equal resistance change lines are thickly ditributed corresponding to the stress distribution. Therefore, the resistive elements must be arranged in parallel with and equidistantly from the chip edges and in the same direction.

The region of the chip requiring care in arranging the resistive elements ranges from the chip edges up to a point where the resistance change between the resistances of the resistive elements before they are resin-sealed and after they are resin-sealed is substantially saturated. This region will be called a piezo-effect zone. The piezo-effect zone may be selected in an area extending from the center line of the dicing line to the portion having the stresses of 90% or less of the stress developed in the center area of the semiconductor substrate.

Figure 9:
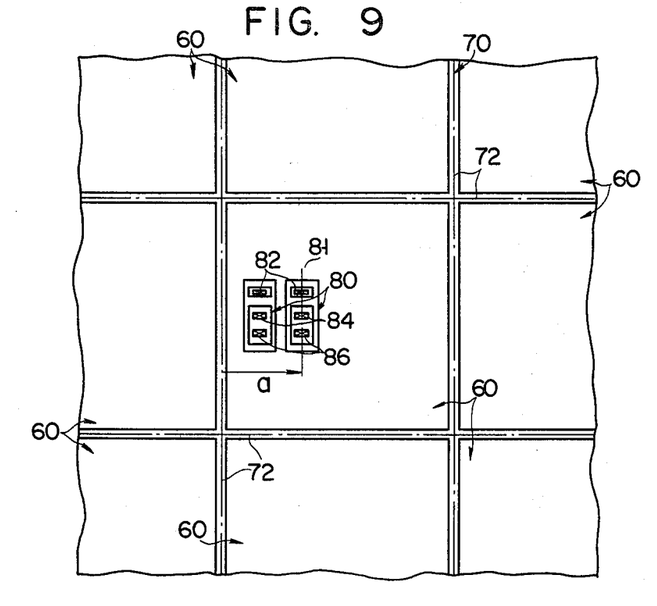
FIG. 9 is a plan view of a poor arrangement of transistors arranged in a wafer.

The arrangement of bipolar-transistors will be described in detail hereinafter. FIG. 9 shows a semiconductor wafer with dicing lines 70 and chips 60 in which are arranged vertical type npn bipolar-transistors 80 which should have paired or corresponding characteristics. The bipolar-transistors 80 are so arranged that the center lines 81 of transistors 80 are in parallel with the center line 72 of the dicing line 70 closest to them, and disposed with different distances from the center line 72 of the dicing line 70. The bipolar-transistors 80 have each a collector electrode 82, an emitter electrode 84 and a base electrode 86.

Figure 10:
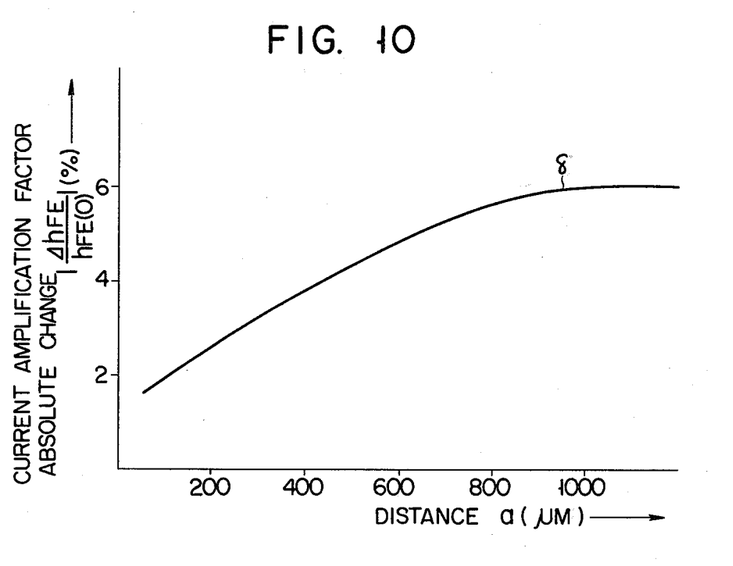
FIG. 10 shows a graph illustrating current amplification factor absolute changes of transistors with respect to a distance a in FIG. 9.

FIG. 10 is a variation of a rate $|\Delta h_{FE}/h_{FE(O)}|$ of a current amplification factor absolute change $|\Delta h_{FE}|$ of the vertical type bipolar-transistors disposed along a line bisecting the chip normal to the dicing line in accordance with a method similar to that of the resistive elements. As in the case of the resistive element the current amplification factor absolute change $|\Delta h_{FE}/h_{FE(O)}|$ saturates at a point distant from the chip ends by about 800 μm. As a matter of course, also in this case, the current amplification factor absolute change is the difference between the current amplification factors of the transistor after the subassembly is resin-sealed and before it is resin-sealed.

A variation pattern of the current amplification factors of the vertical type transistors is similar to the stress distribution pattern of the chip when the subassembly is resin-sealed, as shown in FIGS. 2 and 3. Accordingly, in order to obtain good paired characteristics of the bipolar-transistors arranged in the chip with resin-sealing, any arrangement of the bipolar-transistors is allowed within a region defined by a line of about 800 μm from the chip edge. In the region outside of the 800 μm line (i.e., between the chip edge and the line), the transistors must be arranged such that the center line 81 in the longitudinal direction of each transistor is in parallel with the center line 72 of the dicing line 70 and disposed equidistantly from the center line 72 with the same direction.

In the lateral type transistor, the current amplification factor absolute changes distribute in a pattern different from the stress pattern of the chip but is similar to that of the resistive elements.

The area where care must be taken for arranging the transistor is from the side of the chip to a point where the current amplification factor change saturates, and ranges at least from the center line of the dicing line to a point where the stress is about 90% of the stress in the center area of the semiconductor substrate.

In a case where resistive elements and transistors are together arranged in the same chip, these elements are preferably arranged within an area defined by a line located at least 1.8 times the chip thickness T (FIG. 1) from the center line of dicing line.

How to solve the problem when the resistive elements and/or bipolar-transistors are arranged in the chip with resin sealing has been described. The following explanation is for some embodiments showing the solution.

Figure 11:
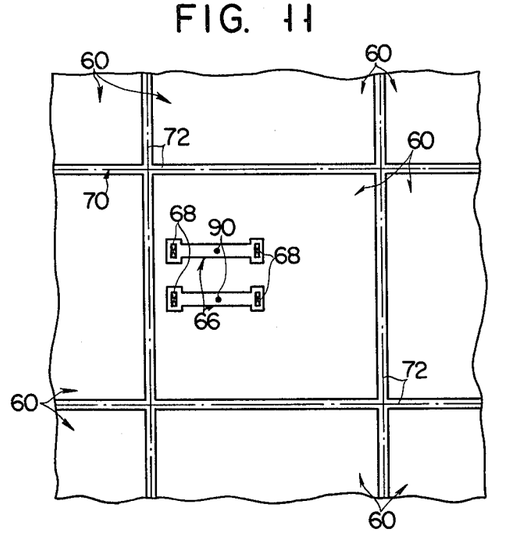
FIG. 11 is a plan view of an embodiment of the present invention in which resistive elements are arranged in a wafer.

FIG. 11 shows a preferred arrangement of resistive elements 66 which should have paired characteristics according to the present invention. Midpoints 90 of a plurality of resistive elements with electrodes 68 are arranged in the same direction equidistantly from the the center line 72 of the dicing line 70 closest to them. The region where the resistive elements are to be disposed is as mentioned above. Alternatively, it may be within the region defined by a line located 1.8 times the thickness T from the center line of the dicing line 70.

Figure 12:
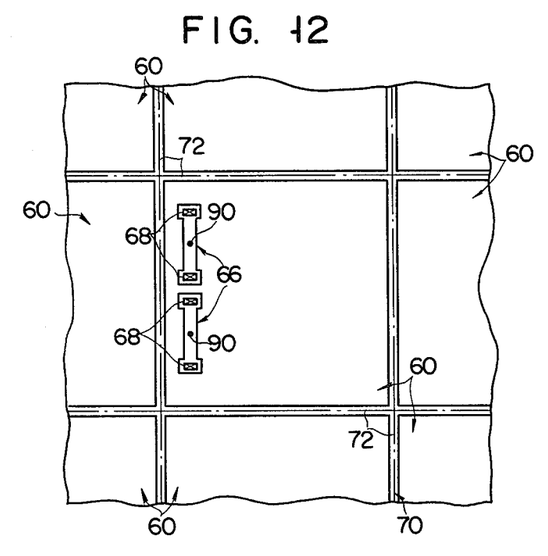
FIG. 12 is a plan view of another embodiment of the present invention in which resistive elements are arranged in a wafer.

FIG. 12 shows another arrangement of a plurality of resistor elements 66 of which the characteristics shall be paired according to the present invention. Unlike the arrangement shown in FIG. 11, the longitudinal direction of the resistive elements with electrodes 68 is in parallel with the center line 72 of the dicing line 70. The midpoint 90 of each resistive element 66 is equidistant from the center line of the dicing line.

The arrangements of the resistive elements as shown in FIGS. 11 and 12 improve the characteristic of the semiconductor device. In a state that a plurality of resistive elements are arranged in the wafer without the resin sealing, the resistive elements have excellently paired characteristics and a variation of the resistances within a resistance characteristic distribution of $3\sigma(=99\%)$ is approximately 1 to 2%. When the resistive elements are arranged in the crystal face {111} as shown in FIG. 9 and are sealed by epoxy resin, the resistance variation within the piezo-effect zone is 3 to 4%. When the wafer surface has the crystal face {100}, it ranges from 2 to 3%. It is within approximately 1 to 2% regardless of the crystal face of the wafer surface when the resistive elements are arranged as shown in FIG. 11 or FIG. 12. Therefore, in this case, the excellently paired characteristics are obtained.

Figure 13:
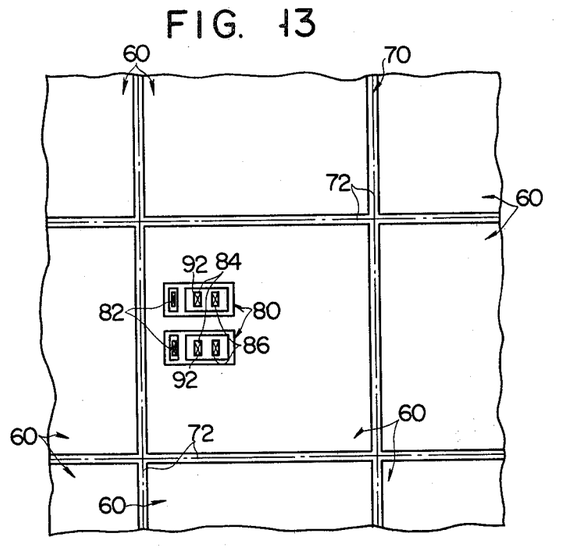
FIG. 13 is a plan view of yet another embodiment of the present invention in which transistors are arranged in a wafer.

In FIG. 13, there is shown a preferred arrangement of a plurality of bipolar-transistors 80 which shall have the paired characteristics according to the present invention. Each bipolar-transistor has a collector electrode 82, an emitter electrode 84 and a base electrode 86. The midpoints 92 of the bipolar-transistors 80 are equally distanced from the center line of the dicing line 70 closest to them and oriented in the same direction with respect to each other. The region for disposing the bipolar-transistors is within an area extending from the center line 72 of the dicing line 70 to a line having stress of 90% of that developed in the center area of the semiconductor stress. The same region may be the region defined by a line distanced from the center line 72 of the dicing line 70 by 1.8 times the thickness T of the chip 60 or less.

Figure 14:
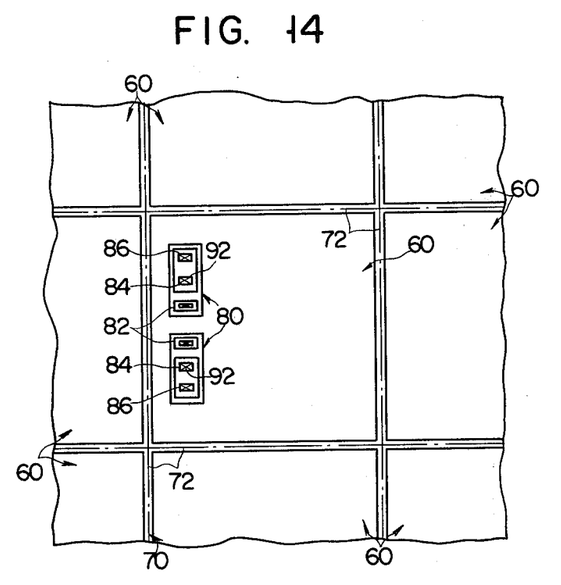
FIG. 14 is a plan view of still another embodiment of the present device in which transistors are arranged in a wafer.

FIG. 14 is an embodiment of another arrangement of a plurality of bipolar-transistors 80 which should have corresponding characteristics. Unlike the arrangement shown in FIG. 13, the bipolar-transistors each having a collector electrode 82, an emitter electrode 84 and a base electrode 86 are longitudinally arranged in parallel with the center line 72 of the dicing line 70. The midpoint 92 of each of the bipolar-transistors is equally distanced from the center line 72 of the dicing line 70. The collector electrode, the emitter electrode and the base electrode of each bipolar-transistor may be arranged in a reflected image fashion with respect to a line perpendicular to the dicing line 70 in a reflected image fashion.

Figure 15:
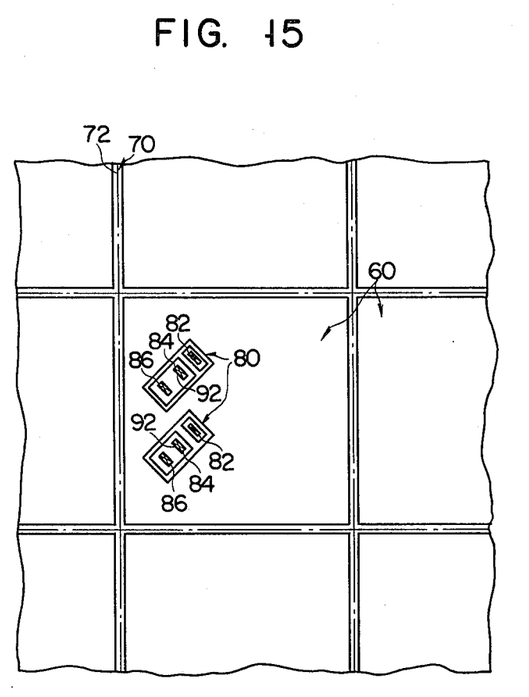
FIG. 15 is a plan view of a further embodiment of the device according to the present invention in which transistors are disposed in a wafer.

FIG. 15 shows a modification of the arrangement of the bipolar-transistors 80 according to the present invention. The midpoint 92 of each bipolar-transistor 80 is equidistant from the center line 72 of the dicing line 70. The center lines of the bipolar-transistors as viewed in the longitudinal direction are in parallel with one another and inclined to the dicing line. In the present embodiment, the collector electrode 82, the emitter electrode 84 and the base electrode 86 are arranged in parallel fashion but may be arranged symmetrically with respect to a point.

The characteristic of the semiconductor device is improved by arranging the bipolar-transistors as shown in FIGS. 13, 14 and 15. When a plurality of the bipolar-transistors are properly arranged in a 3 mm square chip of 300 μm thickness and those are sealed with resin and when the subassembly thus formed is housed in a DIP (dual in line package) of 16 pins, for example, a variation of the current amplification factor distributions in 3σ is 3 to 4% on the periphery portion of the chip. However, when the bipolar-transistors are arranged in accordance with the present invention, the variation may be improved to 1 to 2%, thereby to considerably improve the corresponding characteristics.

In the above-mentioned embodiment, the n-type resistive elements are used for the resistive elements and the bipolar-transistors used are of the npn type. The use of the p-type resistive elements and the pnp bipolar-transistors are within the scope of the present invention. The bipolar-transistor may be replaced by other suitable type transistors such as MOS FET or junction type FET. It is evident that the present invention is applicable for semiconductor devices containing diodes.

While the invention has been described in its preferred embodiments, it should be understood that modifications will occur to those skilled in the art without departing from the spirit of the invention. The scope of the invention is therefore to be determined solely by the appended claims.

What is claimed is:

1. In a semiconductor device, the improvement comprising:
    a semiconductor substrate;
    at least two semiconductor elements with paired characteristics disposed equidistantly from an edge of said semiconductor substrate with the same orientation with respect to each other in said semiconductor substrate, wherein said semiconductor elements are disposed within an area defined by said edge of said semiconductor substrate and by a line which is separated from said edge by a distance 1.8 times the thickness of said semiconductor substrate or less.

2. A semiconductor device according to claim 1, wherein said semiconductor substrate has a surface of {1, 0, 0} and said semiconductor elements are arranged in said surface.

3. A semiconductor device according to claim 1 further comprising:
    a sealing member for integrally sealing said semiconductor substrate and said semiconductor elements disposed in said semiconductor substrate.

4. A semiconductor device according to claim 3, wherein said sealing member is resin.

* * * * *